United States Patent

Kubota

[11] Patent Number: 5,746,991
[45] Date of Patent: May 5, 1998

[54] COMPOSITION FOR GROWING LASER CRYSTALS

[75] Inventor: Yoshinori Kubota, Ube, Japan

[73] Assignee: Central Glass Company, Limited, Yamaguchi, Japan

[21] Appl. No.: 704,469

[22] Filed: Aug. 23, 1996

[30] Foreign Application Priority Data

Aug. 25, 1995 [JP] Japan ................. 7-217000

[51] Int. Cl.$^6$ ................. C01G 57/00; C30B 9/00
[52] U.S. Cl. ................. 423/263; 252/301.4 H; 501/151; 501/152; 501/123; 423/464
[58] Field of Search ................. 423/263, 464, 423/179.5; 252/301.4 H; 117/940; 501/151, 152, 123

[56] References Cited

U.S. PATENT DOCUMENTS

| | | | |
|---|---|---|---|
| 3,649,552 | 3/1972 | Robinson et al. | 117/940 |
| 3,655,332 | 4/1972 | Smith, Jr. | 423/464 |
| 5,478,498 | 12/1995 | Kodama et al. | 423/263 |

OTHER PUBLICATIONS

C.D. Marshall et al. "Ultraviolet Laser Emission Properties of $Ce^{3+}$–doped $LiSrAlF_6$ And $LiCaAlF_6$", J.Opt.Soc.Am.B/ vol. 11, No. 10 1994, pp. 2054–2065, Oct.

*Primary Examiner*—Steven Bos
*Attorney, Agent, or Firm*—Evenson, McKeown, Edwards & Lenahan, PLLC

[57] ABSTRACT

A composition for growing a laser crystal is represented by the formula of $Li[R_n \alpha_{1-n}\ _{(Ga_p}\ In_q)\ \beta_{1-p-q}] F_{6+n}$ where n is within a range from $10^{-5}$ to 0.1, each of p and q is within a range from 0 to 0.6, a total of p and q is within a range from 0.001 to 0.6, $\alpha$ is at least one member selected from the group consisting of Ca, Sr, Ba and Na, $\beta$ is at least one member selected from the group consisting of Al, Cr, Ni, Co and Fe, and R is a rare-earth element. The composition enables the distribution coefficient of rare-earth element to get closer to 1 and thus enables the laser crystal to have a high and uniform concentration of rare-earth element and to have a large size.

5 Claims, 1 Drawing Sheet

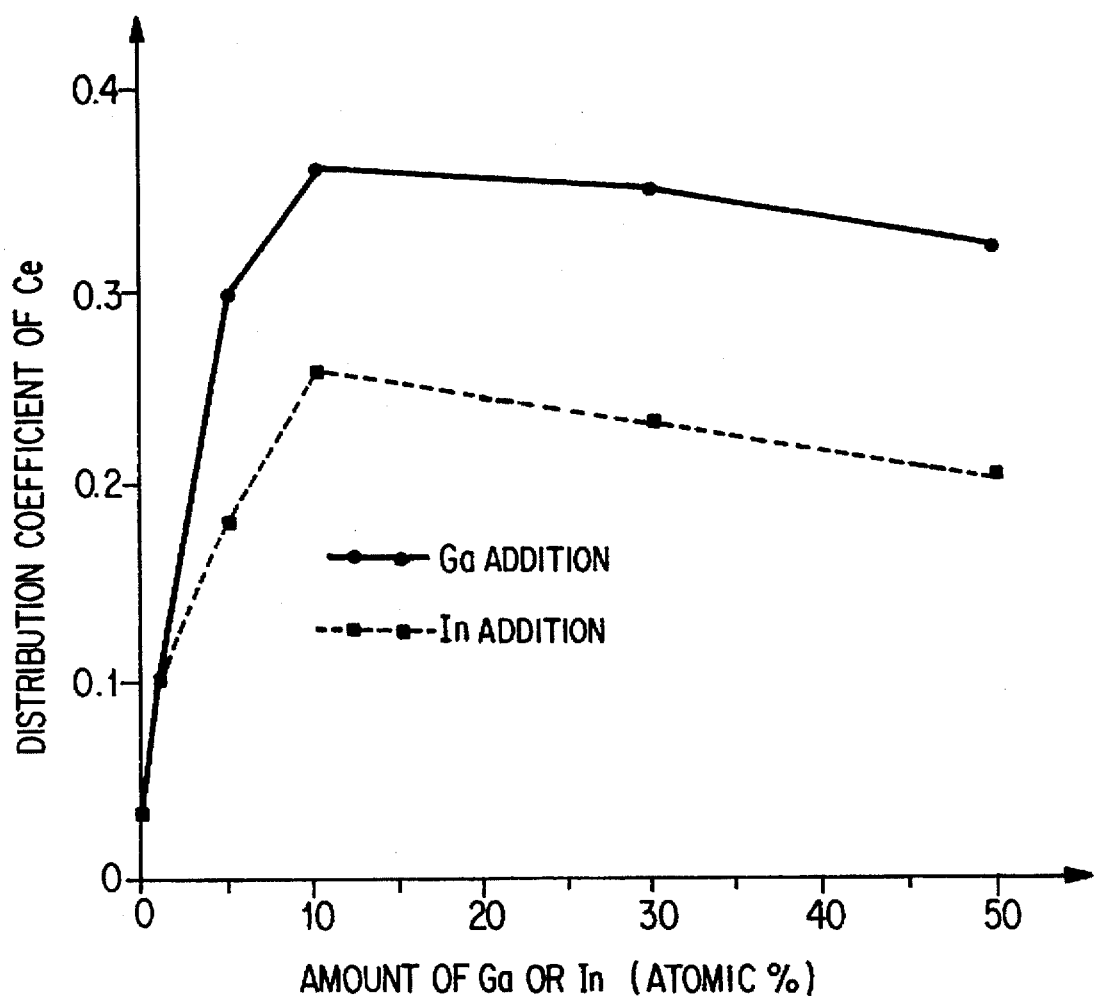

COMPOSITION FOR GROWING LASER CRYSTALS

BACKGROUND OF THE INVENTION

The present invention relates to compositions for growing laser crystals doped with rare-earth elements.

As to $ABCF_6$ laser crystals where "A" is Li, "B" is Ca, Sr and/or Ba, "C" is Al, Cr, Ni, Co and/or Fe, there are known $LiSrAlF_6$ and $LiCaAlF_6$ each of which is doped with about 1 atomic % of Cr. The thus doped crystals are used as infrared tunable laser crystals. There are further known $LiSrAlF_6$ and $LiCaAlF_6$ each of which is doped with Ce in an amount from about 0.01 to about 1 atomic %. The thus doped crystals are used as ultraviolet tunable laser crystals. Host materials of laser crystals, such as $LiSrAlF_6$ and $LiCaAlF_6$, transmit light within a wide wavelength range from a vacuum ultraviolet region (140–150 nm) to an infrared region (around 8 μm), and these host materials are promising as laser crystals doped with rare-earth elements or transition metal elements.

In case that a dopant is added to a laser crystal, the dopant concentration of the crystal becomes lower than the dopant concentration of the starting charge for preparing the crystal. For example, when a laser crystal is grown from a melt, the rare-earth element (dopant) concentration of the crystal becomes lower than the rare-earth element concentration of the melt. In other words, the distribution coefficient (k) becomes lower than 1. The coefficient of k is found by the following expression:

$$k = C_s/C_l$$

where $C_s$ is the rare-earth element concentration of the crystal, and $C_l$ is the rare-earth element concentration of the melt remained after the crystal growth. Thus, as the crystal grows from the melt, the rare-earth element concentration of the remaining melt gradually increases. In proportion to the increase of the rare-earth element concentration of the melt, that of the crystal also increases. If the coefficient of k were 1, both of the melt and the crystal do not change in composition (i.e., the rare-earth element concentration). In contrast to this, as the coefficient of k becomes smaller than 1, the compositional change (i.e., the increase of the rare-earth element concentration) in both of the remaining melt and the crystal becomes greater.

In case that a rare-earth element (trivalent) is added to an $ABCF_6$ laser crystal where "A" is Li, "B" is Ca, Sr and/or Ba, "C" is Al, Cr, Ni, Co and/or Fe, the element of "β" site, of which valency is primarily 2, is partly replaced by the rare-earth element. Due to this charge imbalance, the distribution coefficient of k becomes very small. Therefore, as the crystal grows from a melt, the rare-earth element concentration of the melt increases considerably, and at the same time the rare-earth element concentration of the crystal also increases. By this mechanism during the crystal growth, the obtained crystal becomes inhomogeneous with respect to the rare-earth element concentration. That is, a portion of the crystal that was obtained at the initial stage of the crystal growth has a lower concentration of the rare-earth element. In contrast, another portion of the crystal that was obtained at the final stage of the crystal growth has a higher concentration thereof. If the rare-earth element concentration of the melt increases too much, it becomes technically difficult to grow the crystal.

To solve the above-mentioned problem, there is a proposal to obtain a small amount of crystal from a large amount of melt, in order to reduce the degree of inhomogeneity of the rare-earth element concentration of the crystal. This proposal is not, however, cost effective nor suitable for an industrial-scale production. There is another proposal to intermittently or continuously add the charge in amount that is the same as that of the crystal grown from the melt, in order to maintain the rare-earth element concentration of the melt at a constant level. However, this proposal requires a complicated apparatus, and the actual adjustment of the apparatus is not easy.

Thus, there is a demand for a starting charge composition which enables the distribution coefficient of rare-earth element to get closer to 1 and enables the crystal to have a higher concentration of rare-earth element. For example, there is a proposal to add sodium to the "B" site in $ABCF_6$, together with a rare-earth element, to correct for the above-mentioned charge imbalance (J. Opt. Soc. Am. B Vol. 11, No. 10 (1994) pp. 2054–2065). This addition of sodium contributes to slightly remove the problem of inhomogeneity of the rare-earth element concentration of the crystal, but is not so effective as to sufficiently reduce this problem.

SUMMARY OF THE INVENTION

It is therefore an object of the present invention to provide a composition for growing a laser crystal doped with a rare-earth element, which composition enables the distribution coefficient of rare-earth element to get closer to 1 and thus enables the laser crystal to have a higher and more uniform concentration of rare-earth element, as compared with prior art.

According to the present invention, there is provided a composition for growing a laser crystal, said composition being represented by the formula (1),

$$Li[R_n \alpha_{1-n}][(Ga_p In_q)\beta_{1-p-q}]F_{6+n} \qquad (1)$$

where n is within a range from $10^{-5}$ to 0.1 (preferably from $10^{-5}$ to 0.05), each of p and q is within a range from 0 to 0.6, a total of p and q is within a range from 0.001 to 0.6, α is at least one member selected from the group consisting of Ca, Sr, Ba and Na, β is at least one member selected from the group consisting of Al, Cr, Ni, Co and Fe, and R is a rare-earth element serving as emission center.

The above composition enables the distribution coefficient of rare-earth element to get closer to 1 and thus enables the laser crystal to have a higher and more uniform concentration of rare-earth element and to have a larger size, as compared with prior art.

When Na is added to the composition, the composition is represented by the formula (2),

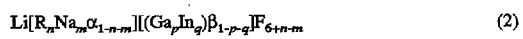

$$Li[R_n Na_m \alpha_{1-n-m}][(Ga_p In_q)\beta_{1-p-q}]F_{6+n-m} \qquad (2)$$

where α is at least one member selected from the group consisting of Ca, Sr and Ba, and a ratio of m to n is within a range from 0 to 5.

In the formula (2), Na is added to correct for the charge imbalance induced by the addition of trivalent rare-earth element (e.g., Ce). When the ratio of m/n is within a range from 0 to 5, it is possible to grow a crystal which has enough quality to be used as a laser crystal. If it is outside this range, it becomes difficult to grow such crystal.

BRIEF DESCRIPTION OF THE DRAWINGS

Figure is a graph showing a relationship between the distribution coefficient of Ce and the concentration of Ga or In added to the starting charge composition, according to the after-mentioned Example 3.

DESCRIPTION OF THE PREFERRED EMBODIMENTS

As stated above, according to the present invention, a composition for growing a laser crystal contains a rare-earth element(s), and at least one of Ga and In. These dopants may be added, in the form of fluoride or of another compound (e.g., oxide) to be fluorinated later, to this starting charge composition As to this fluorination, any method may be taken as long a the another compound can be fluorinated. For example, the another compound may be heated in the presence of acid ammonium fluoride or of ammonium fluoride, or may be treated in an atmosphere containing hydrofluoric acid, fluorine, fluorine trichloride, and/or nitrogen trifluoride.

In the invention, it is necessary that the total of p and q is within a range from 0.001 to 0.6 in the above formula (1). That is, the total amount of Ga and In to be added to the starting charge composition is within a range from 0.1 to 60 atomic % based on the total number of atoms of Ga, In and "β" site element (e.g., Al) in the formula (1). With this, the distribution coefficient of rare-earth element increases significantly. For example, as the total amount of Ga and In to be added to the starting charge composition is increased, the distribution coefficient of Ce increases. When it reaches a range of 10–20 atomic %, the distribution coefficient of Ce becomes maximum. When it exceeds 30 atomic %, the laser crystal quality may become inferior. When it exceeds 60 atomic %, it becomes difficult to grow the crystal. Thus, the total amount of Ga and In is preferably within a range of 5–30 atomic %.

As to the amount of rare-earth element to be added to the starting charge composition, n is within a range from $10^{-5}$ to 0.1 in the formula (1). That is, the amount of rare-earth element is within a range of 0.001–10 atomic % based on the total number of atoms of rare-earth element and "α" site element in the formula (1). The amount of rare-earth element is adjusted depending on the absorption cross section of each rare-earth element, the stimulated emission cross section of a level used in laser oscillation of each rare-earth element, the high level lifetime of each rare-earth element, and the like. For example, it is preferable to add Ce in an amount of 0.01–1 atomic % in the preparation of a 285–310 nm ultraviolet tunable laser crystal. In case of an infrared laser crystal in which 1 µm-band oscillation is conducted by Nd, it is preferable to add Nd in an amount of about 1 atomic %. In case that 1 µm-band oscillation is conducted by Yb, Yb is added preferably in an amount of not less than 1 atomic %. In this case, the upper limit of the Yb addition is about 5 atomic % in view of problems in the crystal growth.

The following nonlimitative examples are illustrative of the present invention.

EXAMPLE 1

At first, LiF, $CeF_3$, $SrF_2$, $GaF_3$ and $AlF_3$ powders, all of which are of ultra high chemical purities, were mixed together, so that the starting charge composition had a formula of $LiCe_{0.006}Sr_{0.994}Ga_{0.1}Al_{0.9}F_{6.006}$. Then, this starting charge was melted in a platinum crucible. Then, a single crystal was grown from this melt by a Czochralski method. The thus obtained crystal and the remaining melt were analyzed to determine the distribution coefficient of Ce. The result was 0.362. By calculation using the result of distribution coefficient of Ce, there was found the amount of melt to be withdrawn from the crucible in the crystal preparation, which is expressed by wt % based on the initial batch weight, for making the Ce concentration of the melt remained in the crucible after the crystal growth two times the initial Ce concentration. The result of this calculation (the amount of melt to be withdrawn) was 8.1 wt %. In other words, when 81 wt % of the melt is crystallized from the crucible, the Ce concentration of the melt doubles.

EXAMPLE 2

In this example, Example 1 was slightly modified as follows. At first, LiF, $CeF_3$, $SrF_2$, $InF_3$ and $AlF_3$ powders, all of which are of ultra high chemical purities, were mixed together, so that the starting charge composition had a formula of $LiCe_{0.006}Sr_{0.0994}In_{0.1}Al_{0.9}F_{6.006}$. The distribution coefficient of Ce was 0.258. Similar to Example 1, the amount of melt to be crystallized was calculated and found to be 63 wt %.

Comparative Example 1

In this example, Example 1 was repeated except that both of Ga and In were omitted as follows. In fact, LiP, $CeF_3$, $SrF_2$ and $AlF_3$ powders, all of which are of ultra high chemical purities, were mixed together, so that the starting charge composition had a formula of $LiCe_{0.01}Sr_{0.99}AlF_{6.01}$. The distribution coefficient of Ce was 0.032. Similar to Example 1, the amount of melt to be crystallized was calculated and found to be 52 wt %.

Comparative Example 2

In this example, Example 1 was repeated except that both of Ga and In were omitted and Na was added as follows. In fact, LiF, NaF, $CeF_3$, $SrF_2$ and $AlF_3$ powders, all of which are of ultra high chemical purities, were mixed together, so that the starting charge composition had a formula of $LiCe_{0.01}Na_{0.01}Sr_{0.98}AlF_6$. The distribution coefficient of Ce was 0.042. Similar to Example 1, the amount of melt to be crystallized was calculated and found to be 53 wt %.

It is understood from the results of Examples 1–2 and Comparative Examples 1–2 that the amounts of melt to be crystallized according to Examples 1–2 are much higher than those according to Comparative Examples 1–2. This means that the rare-earth concentration change in the melt and in the crystal are much more suppressed in Examples 1–2 than in Comparative Examples 1–2. Therefore, according to Examples 1–2, it is possible to grow much more homogeneous crystals with respect to the rare-earth concentration. Furthermore, according to Examples 1–2, it is possible to crystallize a much more amount of the a melt, as compared with Comparative Examples 1–2. Therefore, according to Examples 1–2, it is possible to grow a crystal of much larger size, as compared with Comparative Examples 1–2.

EXAMPLE 3

In this example, Example 1 was slightly modified as follows. At first, LiF, $CeF_3$, $SrF_2$, $GaF_3$, and $AlF_3$ powders, all of which are of ultra high chemical purities, were mixed together, so that a first starting charge composition had a formula of $LiCe_{0.006}Sr_{0.994}Ga_xAl_{1-x}F_{6.006}$ where X is within a range from 0.001 to 0.6. Separately, LiF, $CeF_3$, $SrF_2$, $InF_3$, and $AlF_3$ powders, all of which are of ultra high chemical purities, were mixed together, so that a second starting charge composition had a formula of $LiCe_{0.006}Sr_{0.994}In_xAl_{1-x}F_{6.006}$ where X is within a range from 0.001 to 0.6. Then, first and second single crystals were respectively grown from the first and second starting charge compositions in the same manners as that of Example 1. The distribution coefficient of Ce got closer to 1, as the value of X increased in the preparation of the first and second single crystals. It became maximum, when X was within a range from 0.1 to 0.2. It decreased from the maximum value, when X exceeded 0.2. When X exceeded 0.3, the obtained first and second crystals had a problem of inclusion (i.e., contamination with other crystals). When X increased to about 0.6, it became difficult to grow the crystal. Therefore, it is acknowledged that all the distribution coefficients of Ce in Example 3 exceeded that (0.032) of Comparative Example 1. In Example 3, there was obtained a relationship between -the distribution coefficient of Ce and the concentration of Ga or In added to the starting charge composition, and a graph of this relation is shown in Figure.

What is claimed:

1. A composition for growing a laser crystal, said composition being represented by the formula (1),

  (1)

where n is within a range from $10^{-5}$ to 0.1, each of p and q is within a range from 0 to 0.6, a total of p and q is within a range from 0.001 to 0.6, $\alpha$ is at least one member selected from the group consisting of Ca, Sr, Ba and Na, A is at least one member selected from the group consisting of Al, Cr, Ni, Co and Fe, and R is a rare-earth element.

2. A composition according to claim 1, wherein said composition is represented by the formula (2),

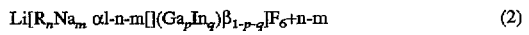  (2)

where $\alpha$ is at least one member selected from the group consisting of Ca, Sr and Ba, and a ratio of m to n is within a range from 0 to 5.

3. A composition according to claim 1, wherein said total of p and q is within a range from 0.05 to 0.3.

4. A composition according to claim 1, wherein said R is Ce, and said n is within a range from $10^{-4}$ to 0.01.

5. A composition according to claim 1, wherein said R is Yb, and said n is within a range from 0.01 to about 0.05.

* * * * *